United States Patent [19]
Yuasa et al.

[11] Patent Number: 6,017,774
[45] Date of Patent: Jan. 25, 2000

[54] METHOD FOR PRODUCING GROUP III-V COMPOUND SEMICONDUCTOR AND FABRICATING LIGHT EMITTING DEVICE USING SUCH SEMICONDUCTOR

[75] Inventors: Takayuki Yuasa; Kazuhiko Inoguchi, both of Nara-ken, Japan

[73] Assignee: Sharp Kabushiki Kaisha, Osaka, Japan

[21] Appl. No.: 08/774,056

[22] Filed: Dec. 23, 1996

[30] Foreign Application Priority Data

Dec. 24, 1995 [JP] Japan .................................. 7-341880
Dec. 28, 1995 [JP] Japan .................................. 7-344223

[51] Int. Cl.$^7$ .................................................. H01L 21/20
[52] U.S. Cl. ............................................ 438/46; 438/479
[58] Field of Search .................................. 257/94, 96, 97, 257/103; 438/22, 46, 478, 479

[56] References Cited

U.S. PATENT DOCUMENTS 5,650,198  7/1997  Denbaars et al. .

FOREIGN PATENT DOCUMENTS 4-139097  5/1992  Japan .
06275541  9/1994  Japan .

OTHER PUBLICATIONS v. Lakhotia et al., "GaN Film Growth Using Single–Source Precursors", Chem Mater. vol. 7, pp. 546–552, Mar. 1995.
Nakamura et al., "High–power GaN P–N junction blue–light–emitting diodes" Japanese *Journal of Applied Physics* (1991) 30:L 1998–L 2001.

Matsuoka et al., "Wide–gap semiconductor InGaN and InGaAlN grown by MOVPE" *Journal of Electronic Materials* (1992) 21:157–163.

Tokuda et al., "MOVPE Growth of GaN using tertiarybutylamine as a nitrogen source" *Proceeding of 55th Applied Physics Conference* (1994) p. 180. A partial English translation is also included herewith.

Boyd et al., "Organometallic azides as precursors for aluminum nitride thin films" *Chemistry of Materials* (1989) 1:119–124.

Li et al., "Radical–assisted organometallic vapor–phase epitaxial growth of GaAs" *Applied Physics Letters* (1991) 59(17):2124–2126.

*Primary Examiner*—Charles Bowers
*Assistant Examiner*—Keith Christianson
*Attorney, Agent, or Firm*—Morrison & Foerster LLP

[57] ABSTRACT

The present invention provides a method for producing a group III-V compound semiconductor including nitrogen as a group V element by an organometallic vapor phase growth method. An organometallic as a group III material, an amine type material or ammonia as a group V material and an organic compound which is decomposed by heating so as to generate radicals are used to perform crystal growth.

15 Claims, 11 Drawing Sheets

— with azo-tertiary-butane
--- without azo-tertiary-butane

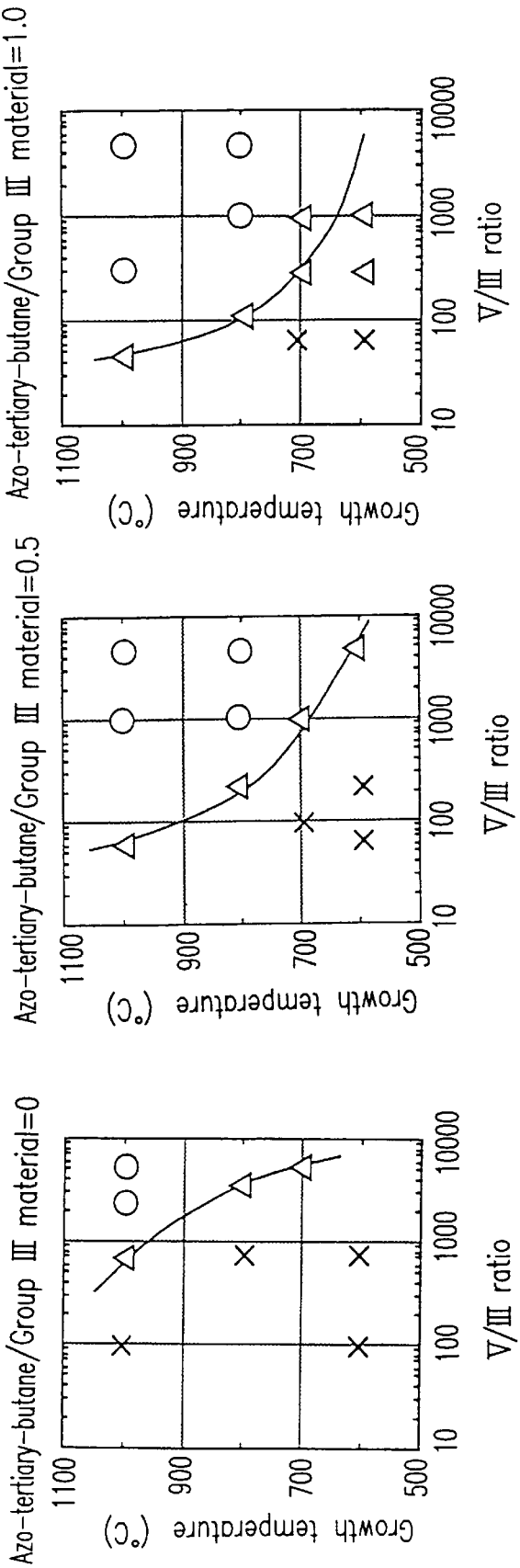

METHOD FOR PRODUCING GROUP III-V COMPOUND SEMICONDUCTOR AND FABRICATING LIGHT EMITTING DEVICE USING SUCH SEMICONDUCTOR

BACKGROUND OF THE INVENTION

1. Field of the Invention

The present invention relates to a method for producing a group, III-V compound semiconductor, and a semiconductor light emitting device using such a semiconductor and a method for producing the same. More specifically, the present invention relates to a semiconductor light emitting device having an excellent efficiency of utilizing a material and excellent heterostructure interface characteristics and a method for producing the same, and a method for producing a group III-V compound which provides such a semiconductor light emitting device.

2. Description of the Related Art

Conventionally, a light emitting diode device and a laser device employing a GaAs type semiconductor material have been used as a semiconductor light emitting device. The colors (wavelength) of light emitted by these semiconductor light emitting devices are in the range from infrared to red.

However, in the case where the writing of information to an optical disk is performed using laser beams generated from these semiconductor light emitting devices, even if the writing of higher density information is to be performed, the density of information to be written is restricted due to the laser beams having a long wavelength. For this reason, a semiconductor light emitting device (semiconductor laser diode) capable of generating laser beams having a shorter wavelength has been increasingly desired.

Accordingly, a short wavelength light emitting a device has been developed by using a group III-V compound semiconductor material including nitrogen (hereinafter, also referred to as a nitride type semiconductor material). Since the group III-V compound semiconductor material has a wide bandgap of 2 eV or more, a short wavelength light emitting device capable of emitting light in a wide range from orange to ultraviolet can be obtained.

At present, a short wavelength light emitting device is generally produced in the following manner: a structure of a device and the compositions of semiconductor layers are determined so that the device can emit light of an intended wavelength by sequentially depositing the semiconductor layers formed of a mixed crystal of a predetermined metal selected from In, Ga and Al and nitrogen at different compositions; and the semiconductor layers are formed by performing crystal growth based on the predetermined structure of the device and the predetermined compositions of the semiconductor layers so as to produce a light emitting device.

For example, according to a crystal growth method for producing a device mainly composed of GaN which emits blue light, an organometallic such as trimethylgallium (TMGa), trimethylaluminum (TMAl), trimethylindium (TMIn) as a group III material and ammonia ($NH_3$) as a group V material are used (see Japanese Journal of Applied Physics Vol. 30/No.12A (1991), pp. 1998).

However, in such a case where a semiconductor film is grown using ammonia, the high decomposition temperature of ammonia makes it difficult to lower the film forming temperature (hereinafter, also referred to as growth temperature). Accordingly, crystal growth must be performed at high temperatures, and as a result, the following problems arise.

For example, the device which emits blue light mainly composed of GaN has a structure where an active layer (light emitting layer) is constituted by an $In_yGa_{1-y}N$ layer ($0 \leq y < 1$), and cladding layers interposing the active layer are constituted by an $Al_xGa_{1-x}N$ layer ($0 \leq x \leq 1$).

In the production of such a blue light emitting device, in order to grow a compound semiconductor film which is crystal-structurally or optically satisfactory using a group III material and ammonia, an $Al_xGa_{1-x}N$ layer ($0 \leq x \leq 1$) requires a temperature of 1000° C. or more as the growth temperature. On the other hand, an $In_yGa_{1-y}N$ layer ($0 \leq y < 1$) requires a temperature of 800° C. or less as the growth temperature in order to suppress evaporation of In atoms (see, for example Journal of Electronic Materials/Vol.21/No.2 (1992), p. 157).

Thus, in the case of the production of a heterostructure of a compound semiconductor film including In and a compound semiconductor film not including In, which is an effective structure as a nitride type semiconductor light emitting device, after one of the compound semiconductor layers is grown, the growth is temporarily interrupted in order to change the growth temperature. For this reason, quality deterioration and/or dislocation are caused by heat during the period required for changing the growth temperature, especially at the interfaces of the heterostructure (i.e., between semiconductor layers having different compositions). As a result, the characteristics of the film deteriorate.

A light emitting device having a semiconductor multilayered structure including a plurality of compound semiconductor layers formed of a quaternary semiconductor material of InAlGaN poses similar problems. The quaternary semiconductor material constituting an active layer should have an energy bandgap different from the quaternary semiconductor material constituting a cladding layer. Accordingly, the active layer is different from the cladding layer in the content of In. As a result, the active layer has a different growth temperature from the cladding layer. Therefore, also in the semiconductor light emitting device using the quaternary semiconductor material of InAlGaN, after a predetermined semiconductor layer is grown, it is necessary to temporarily interrupt the crystal growth of the semiconductor layer to change the growth temperature, as in the case of the device with the heterostructure. For this reason, similarly, the quality is altered and/or dislocation occurs at the interface of the semiconductor layers having different compositions, thus resulting in the deterioration of the characteristics of the film.

Furthermore, regarding the $Al_xGa_{1-x}N$ film, since vapor pressure of the film is high at a high temperature more than 1000° C., a large number of molecules constituting the film sublime during crystal growth (e.g., nitrogen atoms go out of a crystal). As a result, structural, optical and electrical characteristics of an obtained film are not sufficient for practical purposes.

Furthermore, since the bonding strength between hydrogen and nitrogen is stronger than the bonding strength between an organic substance and a group III metallic element, ammonia inefficiently decomposes by heat under growth conditions for the nitride semiconductor. Therefore, a sufficient amount of nitrogen atoms cannot be obtained without supplying an extremely large amount of ammonia with respect to a group III material. Accordingly, a supply ratio of a group V material to a group III material (hereinafter, referred to as V/III ratio) is necessarily as high as about 10000. As a result, the crystal growth method using ammonia also presents the problem of a very poor efficiency of utilization of a material.

In order to solve this problem, as a method for growing a group III-V compound semiconductor containing nitrogen at a low temperature, for example a method of employing an amine type material such as tertiary-butylamine as the group V element has been proposed (see Proceedings of 55th Applied Physics Conference 19a-MG-4, I-pp180). It has also been reported that crystal growth is performed using an organometallic compound having group III-nitrogen bonds as a single material (Japanese Laid-Open Patent Publication No. 4-139097 and Chemistry of Materials/Vol. 1/No. 1 (1989) p. 119).

The above-mentioned method of employing an amine type material (e.g., tertiary-butylamine) has an advantage in that crystal growth can be performed at a low growth temperature such as about 800° C. In this method, however, the amine type material cannot be sufficiently decomposed, so that the following drawbacks are presented: (1) carbon atoms contained in the amine type material are incorporated into the obtained semiconductor film; and (2) nitrogen in the amine type material and an organometallic does not sufficiently react with each other, so that droplets of a metal Ga or the like are formed on the surface of the obtained semiconductor film. These impurities (e.g., carbon atoms) or droplets deteriorate the light emitting characteristics of the semiconductor film. Thus, in the case where the semiconductor film is used for, for example a light emitting device or the like, a light emitting device having sufficient light emitting characteristics cannot be obtained.

According to the method of employing an organometallic compound having group III-nitrogen bonds as a single material, the material is not sufficiently decomposed on the surface of the substrate, so that the following problems are presented: (a) carbon atoms contained in the material are incorporated into the obtained semiconductor film; and (b) a growth efficiency of the semiconductor film relative to a material supply is low.

On the other hand, it is described in Appl. Phys. Lett. 59(17)21 Oct. 1991, p. 2124 that in the growth of a GaAs type semiconductor layer, a growth rate of a GaAs type crystal can be raised by using azo-tertiary-butane as a radical source. In this case, since the growth temperature of the GaAs type crystal is lowered, the problem caused by a high crystal growth temperature involved in the nitride type semiconductor (i.e, sublimation of molecules constituting the semiconductor film by heat) is prevented.

However, in the semiconductor multilayered structure in the semiconductor light emitting device using a GaAs type semiconductor material (e.g., a structure including a GaAs layer as an active layer and AlGaAs layers as cladding layers interposing the active layer), the growth temperature for the GaAs layer is substantially the same as the growth temperature for the AlGaAs layers, regardless of the use of azo-tertiary-butane in the production process (crystal growth). Accordingly, the technique described in the Appl. Phys. Lett. 59(17), 21 Oct. 1991, p.2124 does not solve the problem characteristic of the crystal growth of the nitride type semiconductor (i.e., the problem resulting from the difference between the growth temperatures due to different compositions of the semiconductor layers).

Furthermore, this technique does not solve the problem in crystal growth of the nitride type semiconductor that an efficiency of utilization of the material is poor because the V/III ratio is very high.

SUMMARY OF THE INVENTION

In a method for producing a group III-V compound semiconductor comprising nitrogen as a group V element by an organometallic vapor phase growth method according to the present invention, an organometallic compound as a group III material, an amine type material or ammonia as a group V material and an organic compound which is decomposed by heating so as to generate radicals are used to perform crystal growth.

According to another aspect of the invention, in a method for producing a group III-V compound semiconductor comprising nitrogen as a group V element by an organometallic vapor phase growth method, an organometallic compound containing group III-nitrogen bonds as a group III-V material and an organic compound which is decomposed by heating so as to generate radicals are used to perform crystal growth.

In one embodiment of the invention, the organic compound is azo-tertiary-butane or azomethane.

In another embodiment of the invention, the group III material is trimethylgallium, and the group V material is dimethylamine.

In another embodiment of the invention, the organometallic compound as a III-V material is $C_2H_6GaN_3$.

According to another aspect of the invention, a semiconductor light emitting device includes a plurality of semiconductor layers each constituted by a compound of a predetermined metal selected from the group consisting of Ga, Al and In and nitrogen. The plurality of semiconductor layers include a semiconductor multilayered structure comprising a first compound semiconductor layer constituted by InGaN and a second compound semiconductor layer constituted by AlGaN or GaN. The first and second compound semiconductor layers are formed by an organometallic vapor phase growth treatment using an organometallic compound as a group III material, ammonia or an amine type material as a group V material and an organic compound which is decomposed by heating so as to generate radicals as an organic radical source.

According to another aspect of the invention, a semiconductor light emitting device includes a plurality of semiconductor layers each constituted by a compound of a predetermined metal selected from the group consisting of Ga, Al, and In and nitrogen. The plurality of semiconductor layers include a semiconductor multilayered structure capable of generating laser beams comprising a first compound semiconductor layer constituted by InGaN and a second compound semiconductor layer constituted by AlGaN or GaN. The first and second compound semiconductor layers are formed by an organometallic vapor phase growth treatment using an organometallic compound as a group III material, ammonia or an amine type material as a group V material and an organic compound which is decomposed by heating so as to generate radicals as an organic radical source.

According to another aspect of the invention, a semiconductor light emitting device includes a plurality of semiconductor layers each constituted by a compound of a predetermined metal selected from the group consisting of Ga, Al, and In and nitrogen. The plurality of semiconductor layers include a semiconductor multilayered structure including a plurality of compound semiconductor layers constituted by a quaternary material of InAlGaN. Each of the compound semiconductor layers is formed by an organometallic vapor phase growth treatment using an organometallic compound as a group III material, ammonia or an amine type material as a group V material and an organic compound which is decomposed by heating so as to generate radicals as an organic radical source.

According to anther aspect of the invention, a semiconductor light emitting device includes a plurality of semiconductor layers each constituted by a compound of a predetermined metal selected from the group consisting of Ga, Al, and In and nitrogen. The plurality of semiconductor layers include a semiconductor multilayered structure capable of generating laser beams comprising a plurality of compound semiconductor layers constituted by a quaternary material of InAlGaN. Each of the compound semiconductor layers is formed by an organometallic vapor phase growth treatment using an organometallic compound as a group III material, ammonia or an amine type material as a group V material and an organic compound which is decomposed by heating so as to generate radicals as an organic radical source.

In one embodiment of the invention, the compound semiconductor layer constituting the semiconductor multilayered structure includes at least one selected from the group consisting of Si, Mg and Zn as a dopant for defining a conduction type thereof.

According to another aspect of the invention, a method for producing a semiconductor light emitting device using an organometallic vapor phase growth method includes the step of forming a plurality of semiconductor layers each constituted by a compound of a predetermined metal selected from the group consisting of Ga, Al and In and nitrogen. In the semiconductor layer forming step, an organometallic compound as a group III material, ammonia or an amine type material as a group V material and an organic compound which is decomposed by heating so as to generate radicals as an organic radical source are supplied to a reaction region.

In one embodiment of the invention, the plurality of semiconductor layers are formed at substantially a same growth temperature.

In another embodiment of the invention, the organic compound is azo-tertiary-butane or azomethane.

In still another embodiment of the invention, the method for producing a semiconductor light emitting device includes the step of forming a semiconductor layer constituted by InGaN.

In yet another embodiment of the invention, the method for producing a semiconductor light emitting device includes the step of forming a semiconductor layer constituted by InGaN and a semiconductor layer constituted by AlGaN. These two semiconductor layers are formed at substantially a same growth temperature.

Thus, the invention described herein makes possible the advantages of (1) providing a semiconductor light emitting device having an excellent efficiency of utilization of a material and excellent heterostructure interface characteristics; (2) providing a method for producing a semiconductor light emitting device capable of forming semiconductor layers having different compositions at a low and the same temperature; and (3) providing a method for producing a group III-V compound semiconductor realizing such a semiconductor light emitting device.

These and other advantages of the present invention will become apparent to those skilled in the art upon reading and understanding the following detailed description with reference to the accompanying figures.

BRIEF DESCRIPTION OF THE DRAWINGS

FIGS. 13A through 13C are graphs illustrating the state of a GaN film grown by varying the V/III ratio and the growth temperature.

DESCRIPTION OF THE PREFERRED EMBODIMENTS

Figure 1:
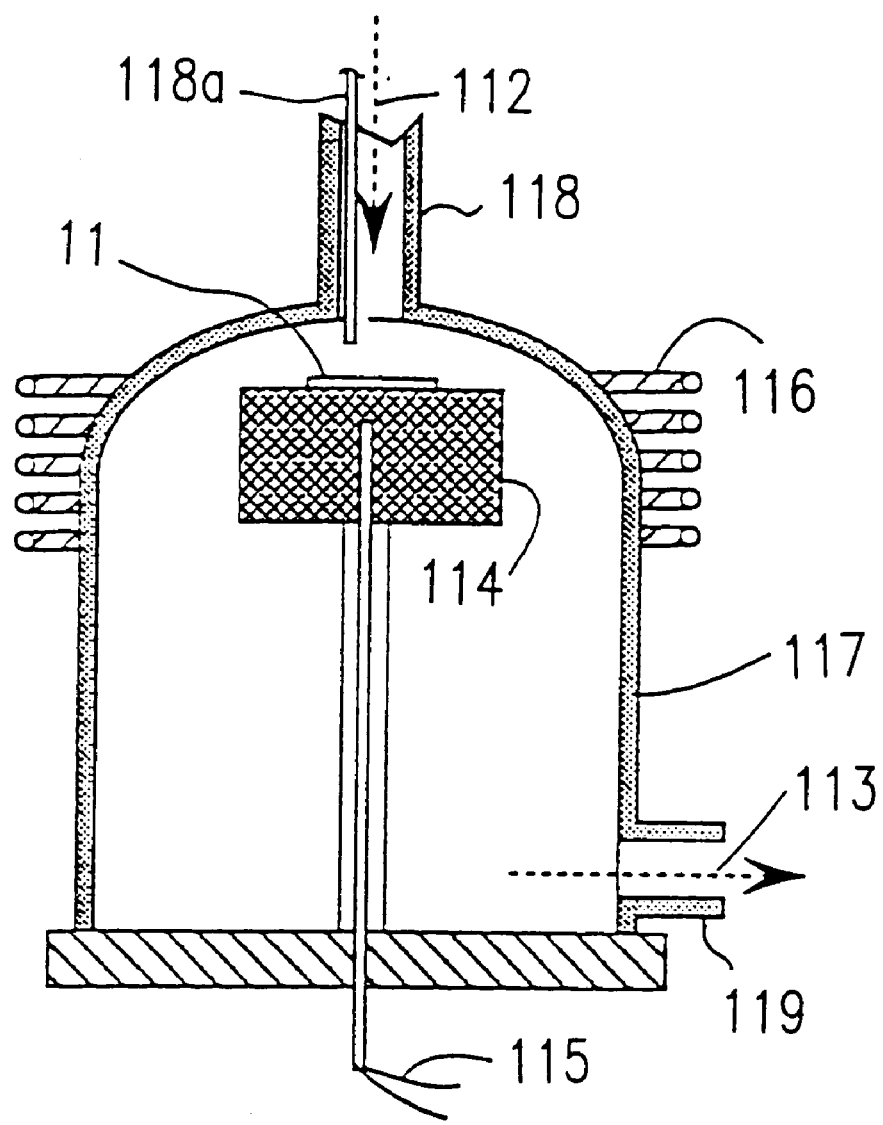
FIG. 1 is a schematic cross sectional view showing an exemplary crystal growth apparatus used in a method for producing a semiconductor of the present invention.

First, some of the basic principles of the present invention will be described.

According to the present invention, an organic material (hereinafter, referred to as an organic radical source) which is decomposed by heat so as to generate radicals is supplied together with a film forming material (i.e., a material capable of being formed into a layer of a semiconductor) to a reactor. Accordingly, the decomposition reaction of the film forming material is facilitated by radicals generated from the organic radical source. As a result, it is possible to grow a semiconductor at a low film forming temperature (growth temperature) and sequentially grow semiconductor crystals having different compositions or constituent elements at the same temperature. Furthermore, it is possible to significantly reduce a V/III ratio (to about 1/30). In order words, a semiconductor light emitting device excellent in an efficiency of utilization of a material (excellent in economy) and having a heterostructure excellent in light emitting characteristics can be made. The detail description follows.

The organic radical source is decomposed at a temperature lower than the film forming material (e.g., ammonia, amine compound, organometallic compound) decomposition temperature so as to generate organic radicals composed of C and H. For example, azo-tertiary-butane, which is a preferable compound as the organic radical source, starts to be decomposed at about 300° C., and generates stable $N_2$ and tertiary-butyl radicals (t-$C_4H_9$ radicals). The tertiary-butyl radicals are activated so as to facilitate the decomposition of the organometallic compound into a metal and alkyl groups. Moreover, the tertiary-butyl radicals contribute to facilitate the decomposition of N—H bonds of ammonia ($NH_3$) or an amine compound.

FIGS. 13A through 13C are graphs illustrating the state of a GaN film grown by varying the V/III ratio and the growth temperature in the case where ammonia is used as the group V material. FIG. 13A shows the case where azo-tertiary-butane is not added; FIG. 13B shows the case where azo-tertiary-butane is added at a mole ratio of 0.5 with respect to a molar amount of the group III material supply; and FIG. 13C shows the case where azo-tertiary-butane is added at a mole ratio of 1 with respect to a molar amount of the group III material supply. In FIGS. 13A through 13C, a circle indicates that a film with a flat and transparent surface is obtained; a triangle indicates that a film with a flat but dark brown surface is obtained; and a cross indicates that a film with a rough and dark brown surface is obtained.

As shown in FIG. 13A, in the case where azo-tertiary-butane is not added, a film with a satisfactory surface can be obtained only at a growth temperature of about 1000° C. or more, and a V/III ratio of about 2000 or more. In contrast, as shown in FIGS. 13B and 13C, in the case where azo-tertiary-butane is added, a film with a satisfactory surface can be obtained even at a V/III ratio of about 1/30 and at a lower growth temperature which is reduced by about 200° C. or more. The film becomes dark brown because undecomposed film forming material molecules containing C and H are incorporated into the obtained film. The surface is rough because the growth conditions are insufficient so that a crystal is not two-dimensionally grown.

Also in the case where an amine compound is used as the group V material, the decomposition efficiency of the material is significantly improved by adding the organic radical source, so that a semiconductor light emitting device excellent in utilization efficiency of the material and excellent in light emitting characteristics having a small amount of impurity content in the semiconductor layer can be obtained. In the case where an amine compound is used as the group V material, the V/III ratio and the growth temperature are lower compared with the case where ammonia is used. Accordingly, the effect of a decrease of the V/III ratio is more significant in the case where ammonia is used.

Figure 14:
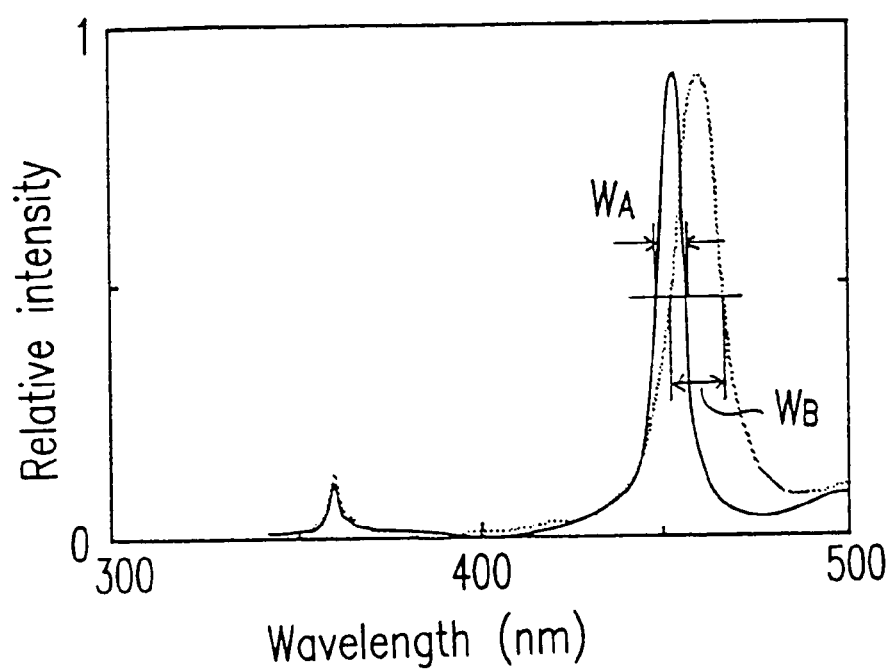
FIG. 14 is a graph showing the spectrum of PL emission in a semiconductor multilayered structure sequentially including a lower GaN layer, an InGaN quantum well layer and an upper GaN layer.

FIG. 14 is a graph showing the spectrum of PL (photoluminescence) emission in a semiconductor multilayered structure sequentially having a lower GaN layer, an InGaN quantum well layer and an upper GaN layer. In FIG. 14, a solid line indicates the PL emission from a semiconductor multilayered structure (sample A) produced adding azo-tertiary-butane at a mole ratio of 1 with respect to a molar amount of an organometallic material supply, and a broken line indicates the PL emission from a semiconductor multilayered structure (sample B) produced without adding azo-tertiary-butane.

The supply amount of the group V material and the group III material and the growth temperature are the same for both of the samples. In the case where azo-tertiary-butane is used, the lower GaN layer, the InGaN quantum well layer and the upper GaN layer are sequentially grown at a growth temperature of 800° C. On the other hand, in the case where azo-tertiary-butane is not used, after the lower GaN layer is grown at a growth temperature of 1000° C., the crystal growth is temporarily interrupted so as to lower the growth temperature to 800° C. Then, after confirming that the temperature has been stably held at 800° C., the InGaN layer is allowed to be grown. Furthermore, after the thickness of the InGaN film reaches a predetermined thickness, the growth is interrupted so as to raise the growth temperature to 1000° C. After confirming that the temperature has been stably held at 1000° C., the upper GaN film is allowed to be grown.

The PL emission (in the vicinity of wavelength of 450 nm) from the InGaN quantum well layer of sample A produced using azo-tertiary-butane is compared with that of sample B produced not using azo-tertiary-butane. As understood from FIG. 14, a full width at half maximum WA of the PL emission for sample A is as small as about 50 meV whereas a full width at half maximum WB of the PL emission for sample B is as large as about 100 meV. In other words, the light emitting characteristics of sample A is more excellent than that of sample B. This is because the crystal growth is interrupted so as to change the growth temperature for sample B, so that the state of the InGaN film is changed by heat during that period. The PL emission in the vicinity of wavelength of 370 nm comes from the GaN layer.

As described above, according to the present invention, not only is the crystal growth rate raised as in the case of using the organic radical source in the crystal growth of a GaAs type semiconductor material, but also the following advantages are provided: (a) a nitride type semiconductor material which cannot conventionally be satisfactorily crystal-grown at a low temperature is satisfactorily crystal-grown at a low temperature; and (b) a nitride type semiconductor material which cannot conventionally be crystal-grown at the same temperature due to different compositions or constituent elements is crystal-grown at the same temperature.

Hereinafter, the present invention will be described by way of preferable embodiments, but it is not limited thereto.

(Embodiment 1)

In this embodiment, a method for producing a nitride type semiconductor will be described.

FIG. 1 is a schematic cross sectional view showing an exemplary crystal growth apparatus used in the present invention. In this crystal growth apparatus, a material gas (i.e., film forming material) is introduced from a gas introduction inlet 118 to a reactor 117 made of quartz, as shown by arrow 112. The gas is exhausted through a gas exhaust outlet 119, as shown by arrow 113. The gas introduction inlet 118 is provided with an organic radical source introduction tube 118a for introducing an organic radical source to the reactor 117 independently of the material gas. A susceptor 114 made of carbon is located in the reactor 117, and a substrate 11 is located on the susceptor 114 and immediately below the gas introduction inlet 118. The susceptor 114 is induction-heated by a high frequency heating coil 116, and the temperature of the substrate 11 is indicated by a thermocouple 115.

Growth of a nitride type semiconductor using this crystal growth apparatus can be performed, for example as follows.

First, the substrate (e.g., a sapphire substrate) 11 with a cleaned surface is mounted on the susceptor 114, and the atmosphere inside the reactor 117 is substituted with hydrogen of high purity. Next, a gas including at least one of hydrogen gas and nitrogen gas is introduced into the reactor 117. The balance between the gas supplied to the reactor 117 and the gas exhausted from the reactor 117 is adjusted so that the pressure in the reactor 117 is adjusted to about 100 Torr. Then, the susceptor 114 is induction-heated using the high frequency heating coil 116, and the substrate 11 is cleaned by maintaining the substrate at a substrate temperature of 1100 to 1200° C. for about 10 minutes. Thereafter, the substrate temperature is reduced to 1100° C., and then a group V material gas is introduced into the reactor 117 and the substrate 11 is subjected to a nitriding treatment by maintaining as it is for 30 minutes.

Next, setting the substrate temperature at a growth temperature (800° C. in this embodiment), a group III material gas is introduced into the reactor 117 so as to start crystal growth. The organic radical source is introduced into the reactor 117 via the introduction tube 118a at the same time with the group III material gas. Since the organic radical source is easily decomposed by heat, it is preferable to locate the organic radical introduction tube 118a above the substrate independently of the material gas introduction inlet 118 so that the generated radicals do not disappear until reaching the substrate 11, or prereaction of other materials stemming from the radicals can be suppressed.

Alternatively, as a material formed into a nitride type semiconductor (group III-V compound semiconductor), an organometallic compound gas having group III-nitrogen bonds which is a single material can be used. In the case where such a single material gas is used, the cleaning of the substrate 11 is performed at 1100 to 1200° C. for about 10 minutes, and the nitriding treatment is performed with ammonia at a substrate temperature of 1100° C. for 30 minutes. Then, The substrate temperature is set at a growth temperature (e.g., 800° C.), and then the organic radical source is supplied together with the material gas.

As the group III material gas, for example, organometallic gasses including organic gallium such as TMGa; organic aluminum such as TMAl; organic indium such as TMIn can be used. As the group V material gas, for example, amine type material gases such as monomethylamine, dimetylamine, diethylamine, tertiary-butylamine; or ammonia can be used.

Examples of the organometallic compound gas having group III-nitrogen bonds which is a single material include an organometallic compound having a $R_2MN_3$ (R: an alkyl group, M: Ga, Al, In or the like) structure. Specific examples of such organometallic compounds include $C_2H_6GaN_3$, $C_2H_6AlN_3$, $C_2H_6InN_3$, $C_4H_{10}GaN_3$, $C_4H_{10}AlN_3$, $C_4H_{10}InN_3$ or the like.

In the present invention, in addition to these material gasses, the organic radical source is used. The organic radical source is an organic compound which generates radicals by being decomposed by heat. Examples of such an organic radical source include a compound having an azo group such as azo-tertiary-butane $((t-C_4H_9)_2N_2)$, azomethane, benzene-azomethane; a compound having an azide group such as ethylazide.; a hydrazine type compound such as hydrazine, monomethyl-hydrazine and dimethyl-hydrazine. The organic radical source used in the present invention is not limited thereto. As long as the advantages of the present invention are not impaired, any organic compound which can easily generate radicals can be used. A preferable organic radical source is a compound having an azo group, and a particularly preferable organic radical source is azo-tertiary-butane and azomethane. This is because the compound having an azo group can easily generate radicals by releasing $N_2$ via pyrolysis. For example, it is known that azo-tertiary-butane is easily converted to $t-C_4H_9$ radical by pyrolysis.

The organic radical source can be used preferably at a mole ratio of 0.5 or more, more preferably 1.0 or more with respect to the group III material gas. Alternatively, the organic radical source can be used preferably at a mole ratio of 0.5 or more, more preferably 1.0 or more with respect to the organometallic compound gas having group III-nitrogen bonds.

According to the present invention, the material formed into the nitride type semiconductor and the organic radical source are used in combination, so that it is possible to perform crystal growth (organometallic vapor phase growth) at a low temperature of about 800° C., and nitrogen atoms can be effectively incorporated into the obtained semiconductor crystals. As a result, a semiconductor film (semiconductor crystal) excellent in a growth efficiency of the semiconductor relative to the material supply amount and having a small content of impurities (i.e., structurally, optically and electrically excellent) can be obtained.

Example 1

A GaN film was produced using dimethylamine as a group V material gas, TMGa as a group III material gas and azo-tertiary-butane as an organic radical source.

The substrate was subjected to cleaning and a nitriding treatment in the same procedure as Embodiment 1, using the crystal growth apparatus shown in FIG. 1. Then, setting a growth temperature at 800° C. and a V/III ratio at 100, azo-tertiary-butane was added at a mole ratio of 1 with respect to a molar amount of TMGa supply, and a 2 μm thick GaN film was grown so as to obtain a test sample.

As a comparative sample, a GaN film was produced in the same manner as described above, except for not adding azo-tertiary-butane.

Figure 2:
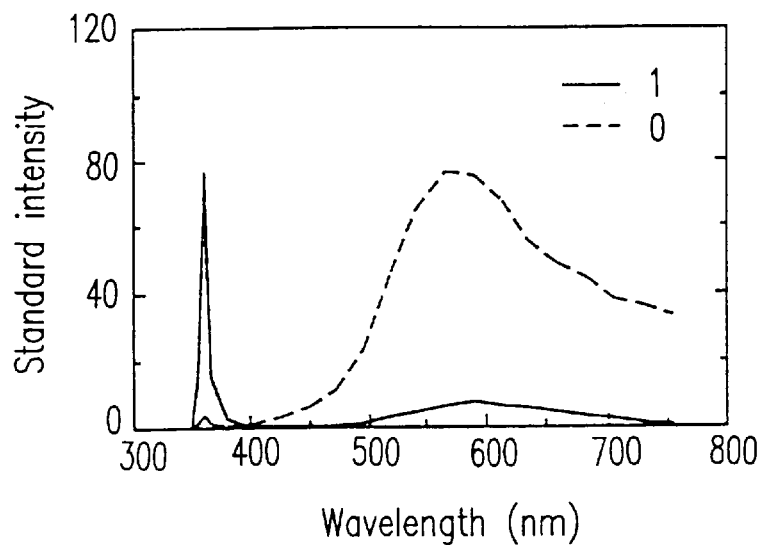
FIG. 2 is a graph showing results of measurements of a GaN film obtained in Example 1 at 4.2 k by PL (photoluminescence).

The results of measurements of the obtained GaN films at 4.2 K by PL (photoluminescence) are shown in FIG. 2. A solid line indicates the results of the GaN film obtained using azo-tertiary-butane, and a broken line indicates the results of the GaN film obtained not using azo-tertiary-butane. An He-Cd laser was used as the light source for the measurement.

As understood from FIG. 2, by producing the GaN film using azo-tertiary-butane, emission at long wavelengths (in the vicinity of 560 nm), which is believed to result from the contamination of carbon atoms, is reduced, and emission in the vicinity of band edge required for the light emitting device is predominant. In other words, by producing the GaN film using azo-tertiary-butane, a semiconductor excellent in light emitting characteristics can be obtained.

Example 2

The effect of the organic radical source on the V/III ratio was examined.

Test samples and comparative samples with a variety of V/III ratios were produced in the same manner as Example 1.

For the GaN film obtained without azo-tertiary-butane, a large number of Ga droplets were generated on the film surface at a V/III ratio of 100 or less. By contrast, for the GaN film obtained using azo-tertiary-butane, droplets were not observed on the film surface until at V/III ratio of about 30. In other words, it was found that, by using azo-tertiary-butane, it was possible to form a satisfactory semiconductor film at a low V/III ratio, and an efficiency of utilization of the material was significantly improved.

Example 3

An AlGaN mixed crystal and an InGaN mixed crystal were examined.

TMGa as the Ga material gas which is a group III material gas, TMAl as the Al material gas and TMIn as the In material were used, and dimethylamine as the group V—material gas and azo-tertiary-butane as the organic radical source were used to produce an AlGaN film (AlGaN mixed crystal) and an InGaN film (InGaN mixed crystal). The supply ratio of the group III material was adjusted so that the Al composition and the In composition in the obtained film were 20%, respectively. Furthermore, the V/III ratio was adjusted by adjusting the supply amount of the group III material while keeping the molar amount of the group III element supply constant.

In either mixed crystal of AlGaN and InGaN, by using azo-tertiary-butane, an amount of impurities such as carbon atoms incorporated into the film is reduced, and droplets of Ga are not generated on the film surface even at a low V/III ratio, thus obtaining a satisfactory film.

Example 4

As the group V material, monoethylamine, diethylamine, or tertiary-butylamine was used instead of dimethylamine to perform the same examinations as in Examples 1 to 3. As a result, the effect of using azo-tertiary-butane was confirmed as in Examples 1 to 3.

Example 5

A semiconductor produced using an organometallic compound gas of a single material was examined. More specifically, a GaN film was produced using $C_2H_6GaN_3$ which was the organometallic compound gas having group III-nitrogen bonds as the single material and azo-tertiary-butane as the organic radical source.

Using the crystal growth apparatus shown in FIG. 1, the substrate was subjected to cleaning and a nitriding treatment in the same procedure as in Embodiment 1. Then, a 2 μm thick GaN film was grown at a growth temperature of 800° C. GaN films produced adding azo-tertiary-butane at a mole ratio of 1 and 2 with respect to the supply of $C_2H_6GaN_3$ were used as test samples 1 and 2, respectively. A GaN film produced without azo-tertiary-butane was used as a comparative sample.

Figure 3:
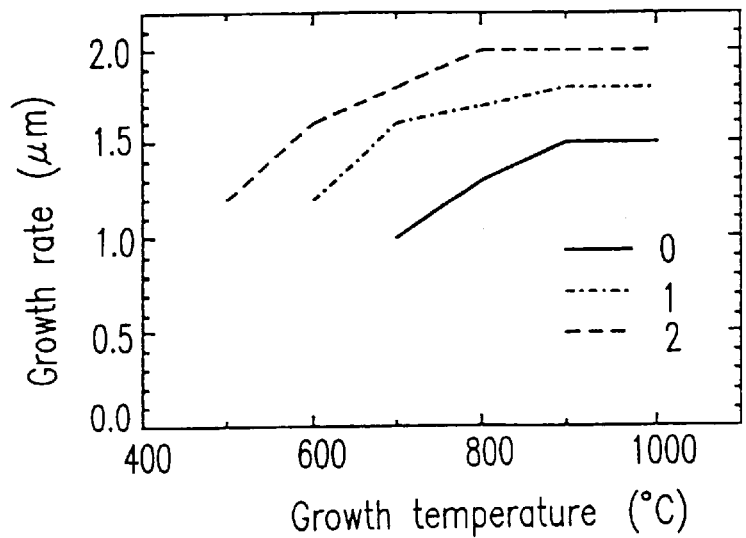
FIG. 3 is a graph showing the relationship between the growth temperature and the growth rate of a GaN film obtained in Example 5.

The relationship between the growth temperature and the growth rate of the obtained GaN films is shown in FIG. 3. A solid line indicates that of the comparative sample, a dash-dot line indicates that of the test sample 1, and a broken line indicates that of the test sample 2.

As understood from FIG. 3, by using azo-tertiary-butane, the growth rate is raised. This results show that the organic radical contributes to decomposition of the material and facilitates the growth of the film. For example, in the case where azo-tertiary-butane is added at a mole ratio of 1 with respect to the semiconductor material, the growth rate is raised by a factor of about 1.5 at a growth temperature of 800° C., compared with the case where azo-tertiary-butane is not added. Thus, the utilization efficiency of the material is improved.

Furthermore, the observation of the obtained GaN films reveals that the GaN film obtained without azo-tertiary-butane is colored dark brown, indicating that undecomposed atoms such as carbon atoms and hydrogen atoms of the material are incorporated into the film. In contrast, the GaN film obtained using azo-tertiary-butane is transparent by sight, indicating that impurities are scarcely included in the film.

Example 6

Semiconductors produced by using a variety of organometallic compounds as an organometallic compound gas having group III-nitrogen bonds were examined.

The same examination as Example 5 was performed about the semiconductor obtained using $C_2H_6AlN_3$, $C_2H_6InN_3$, $C_4H_{10}GaN_3$, $C_4H_{10}AlN_3$, and $C_4H_{10}InN_3$ instead of $C_2H_6GaN_3$. In all of these cases, the effect of using azo-tertiary-butane was confirmed as in the case of $C_2H_6GaN_3$.

Example 7

The same experimentation as Example 1 to 6 was performed about the semiconductors obtained using azomethane and benzene-azomethane instead of azo-tertiary-butane as the organic radical source. As a result, also in the case where compounds comprising these azo groups were used, the same effect as the case of using azo-tertiary-butane was confirmed.

(Embodiment 2)

Figure 4:
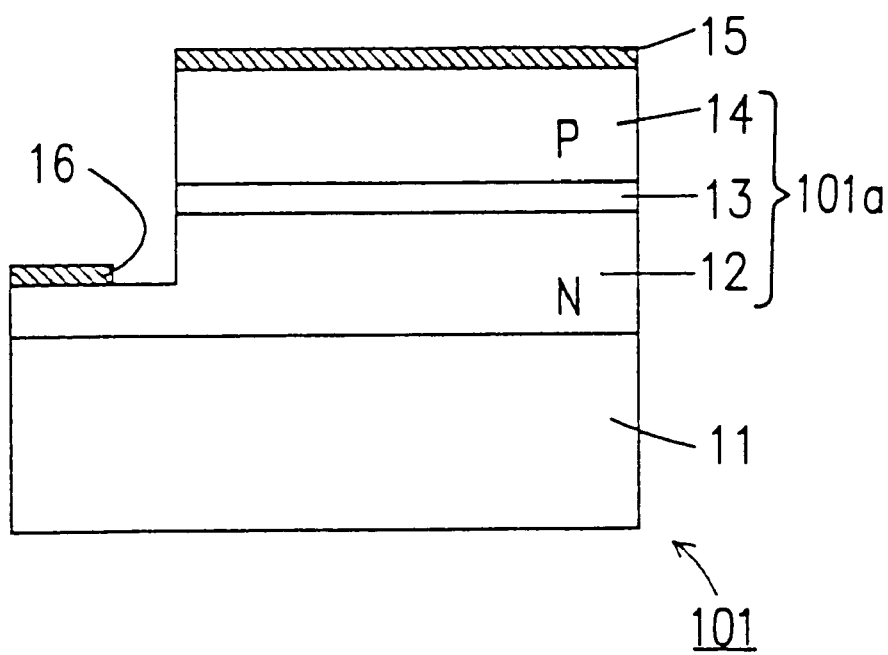
FIG. 4 is a schematic cross sectional view showing a semiconductor diode of a preferable embodiment of a semiconductor light emitting device of the present invention.

A light emitting diode will be described as a preferable embodiment of a semiconductor light emitting device of the present invention. FIG. 4 is a schematic cross sectional view showing an exemplary light emitting diode.

As shown in FIG. 4, a light emitting diode 101 includes a sapphire substrate 11 with a (0001) plane surface and a semiconductor multilayered structure 101a on the substrate 11. The semiconductor multilayered structure 110a includes a lower cladding layer 12, an active layer 13 and an upper cladding layer 14 in this order from the substrate 11. The lower cladding layer 12 is formed of a 2 μm thick n-type GaN layer which is doped with Si to a carrier concentration of $1 \times 10^{19}$ cm$^{-3}$. The active layer 13 is formed of a 0.01 μm thick $In_{0.2}Ga_{0.8}N$ layer. The upper cladding layer 14 is formed of a 2 μm thick p-type GaN layer which is doped with at least one of Mg and Zn (Mg in this embodiment) to a carrier concentration of $1 \times 10^{18}$ cm$^{-3}$.

The semiconductor multilayered structure 101a has a sectional structure in which the lower cladding layer 12 is partially exposed. A metal electrode 16 is formed on at least part of the exposed portion of the lower cladding layer 12, and a metal electrode 15 is formed on at least part of the surface of the upper cladding layer 14.

The lower cladding layer 12, the upper cladding layer 14 and the active layer 13 are formed by an organometallic vapor phase growth treatment, using an organometallic as the group III material, ammonia or an amine type material as the group V material and an organic compound generating radicals by pyrolysis as the organic radical source. The metal electrodes 15 and 16 are formed of a metal material which provides an ohmic contact with the p-type GaN constituting the upper cladding layer 14 and the n-type GaN constituting the lower cladding layer 12, respectively. The metal material is not particularly limited, and any metals which can used for electrodes of a semiconductor light emitting device can be used.

A light emitting operation of this semiconductor light emitting device (light emitting diode) will be described. A voltage is applied between the p-type electrode 15 and the n-type electrode 16 to allow current to flow, so that an electron concentration in the n-type cladding layer 12 and a hole concentration in the p-type cladding layer 14 increase. These increased electrons and holes drift to the InGaN active layer 13, and the electrons and the holes are rebound in the InGaN active layer 13. Energy generated by this recombination is released as light. This light is generally released to the direction perpendicular to the facet of the substrate (i.e., to the direction perpendicular to the sheet). Thus, a light emitting operation of the light emitting diode is carried out.

Figure 5:
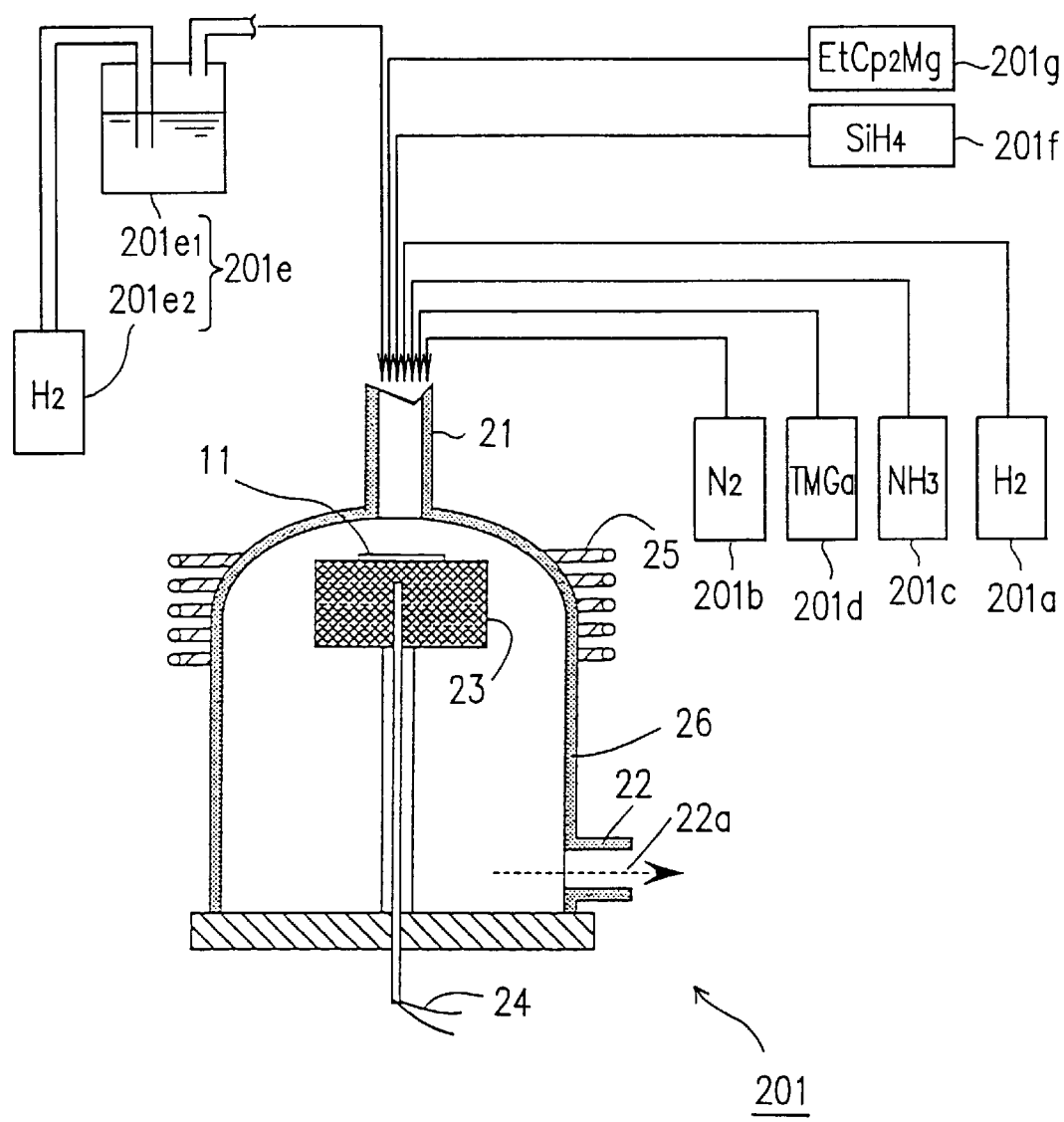
FIG. 5 is a schematic cross sectional view showing an exemplary crystal growth apparatus used in a method for producing a semiconductor light emitting device of the present invention.

Next, a preferable example of a method for producing a semiconductor light emitting device (light emitting diode) will be described. FIG. 5 is a schematic cross sectional view of a crystal growth apparatus used in the method for producing the semiconductor light emitting device.

As shown in FIG. 5, a crystal growth apparatus 201 includes a reactor 26 made of quartz for effecting a film forming reaction (growth reaction). A material gas or the like is introduced into a gas introduction tube 21 provided above the reactor 26, and an exhaust gas 22a is exhausted through a gas exhaust outlet 22 provided in a lower portion of the reactor 26.

A susceptor 23 made of carbon is disposed inside the reactor 26, and a substrate 11 is placed on the susceptor 23 immediately below the gas introduction tube 21. A high frequency heating coil 25 for induction-heating the susceptor 23 is provided along the surface of the upper wall of the reactor 26. A thermocouple 24 is inserted in the susceptor 23 so that the temperature of the substrate 11 on the susceptor 23 can be detected.

Furthermore, the crystal growth apparatus 201 includes an $H_2$ gas supply source 201a, a $N_2$ gas supply source 201b, a $NH_3$ gas supply source 201c, a TMGa supply source 201d, a $SiH_4$ gas supply source 201f and an organic Mg supply source 201g. In addition, the crystal growth apparatus 201 also includes an organic radical source supply source 201e. Gases are supplied from the respective gas supply sources to the reactor 26 via the gas introduction tube 21.

The organic radical source supply source 201e includes a container 201e1 filled with an organic radical source (azo-tertiary-butane in liquid form in this embodiment) and an $H_2$ gas supply source 201e2. The azo-tertiary-butane in liquid form in the container 201e1 is bubbled with the $H_2$ gas so as to be supplied as a gas to the reactor 26.

Next, a method for producing a semiconductor light emitting device will be specifically described.

First, the substrate (e.g., a sapphire substrate) 11 with a cleaned surface is placed on the susceptor 23, and the atmosphere inside the reactor 26 is substituted with hydrogen of high purity. Next, at least one of a hydrogen gas and a nitrogen gas is supplied to the reactor 26, and the reactor 26 is evacuated. The balance between the gas supplied to the reactor 26 and the gas exhausted from the reactor 26 is adjusted, so that the pressure in the reactor 26 is adjusted to about 100 Torr.

Then, the susceptor 23 is induction-heated by the high frequency heating coil 25, and the substrate 11 is cleaned by maintaining the substrate at a substrate temperature of 1100 to 1200° C. for about 10 minutes. Thereafter, the substrate temperature is reduced to 1100° C., and then a group V material gas is introduced into the reactor 26. This state is maintained for 30 minutes, so that the substrate 11 is subjected to a nitriding treatment.

Next, setting the substrate temperature at a growth temperature (800° C.), a group III material gas is introduced into the reactor 26 together with a group V material gas so as to start crystal growth. At this point, an organic radical source is introduced into the reactor 26 at the same time with the group III material gas. Thus, a lower cladding layer 12 constituted by an n-type GaN layer is formed on the substrate 11. Herein, using ammonia as the group V material, TMGa as the group III material and a $SiH_4$ gas as an n-type dopant material gas, crystal growth of the GaN layer is performed at a V/III ratio of 8000. Azo-tertiary-butane $((t-C_4H_9)_2N_2)$ is used as the organic radical source at a mole ratio of 1 with respect to a molar amount of the group III material (TMGa) supply. It is known that this azo-tertiary-butane easily generates tertiary-butyl radicals ($t-C_4H_9$ radicals) by pyrolysis.

Next, an active layer 13 formed of InGaN is grown on the lower cladding layer 12. Herein, while maintaining the growth temperature of 800° C., TMIn (trimethylindium) in addition to TMGa are supplied as the group III material. Azo-tertiary-butane is used as the organic radical source and supplied to reactor 26 at a mole ratio of 1 with respect to a molar amount of the group III material supply (TMIn+TMGa).

Next, an upper cladding layer 14 formed of a p-type GaN layer is formed on the active layer 13 in the same manner as in forming the lower cladding layer 12, except that $EtCp_2Mg$ (bisethyl cyclopentadienylmagnesium), which is a p-type dopant material instead of an n-type dopant material gas ($SiH_4$ gas), is used as a dopant for defining the conduction type.

Thereafter, a selective etching is performed from the surface of the upper cladding layer 14 to a predetermined position of the lower cladding layer 12 by a known method. Furthermore, ohmic electrodes 16 and 15 are formed on exposed portions of the lower cladding layer 12 and the surface of the upper cladding layer 14, respectively. Furthermore, the substrate is divided to a predetermined size to complete a semiconductor light emitting device (LED chip) 101.

In this embodiment, the case where the upper and lower cladding layers are formed of GaN crystals has been described, but the upper and lower cladding layers can be formed of AlGaN crystals.

Furthermore, in this embodiment, the case where a specific compound (TMIn, ammonia or the like) are used as the group III material and the group V material has been described for simplicity. However, materials to be used are not limited to these compounds, and for example compounds described in Embodiment 1 can be preferably used as the group III material and the group V material.

Next, functions and effects of the present invention will be described.

According to this embodiment, the lower cladding layer 12, the active layer 13 and the upper cladding layer 14 can be sequentially formed at the same growth temperature (800° C. in this embodiment). Accordingly, since it is unnecessary to change the growth temperature for forming each layer, damage and quality deterioration at the semiconductor layer interface are not caused by heat during a period of time required to change the growth temperature. Moreover, dislocation is less likely generated at the semiconductor layer interface.

As described above, the present invention is particularly effective in producing a light emitting device having a multilayered structure including semiconductor layers with different compositions (e.g., a layer containing In and a layer not containing In).

Furthermore, in this embodiment, it is significantly easy to obtain a p-type semiconductor by Mg doping. This means that there are few bonds of Mg atoms and hydrogen atoms in the obtained semiconductor layer (semiconductor film). In order words, the effect of the organic radicals can provide a semiconductor film scarcely containing hydrogen atoms (impurities).

Example 8

A test showing an effect of an organic radical in crystal growth of GaN and InGaN will be described.

A GaN crystal (GaN film) was formed by varying the amount of an organic radical source. More specifically, the organic radical source was added at a mole ratio of 0, 0.5 and 1 with respect to the TMGa amount so as to form a GaN film. Ammonia as the group V material and TMGa as the group III material were used to perform crystal growth at a V/III ratio of 8000. Azo-tertiary-butane (($t$-$C_4H_9$)$_2N_2$) was used as the organic radical source. The details of the crystal growth is the same as the description of Embodiment 2.

Figure 6:
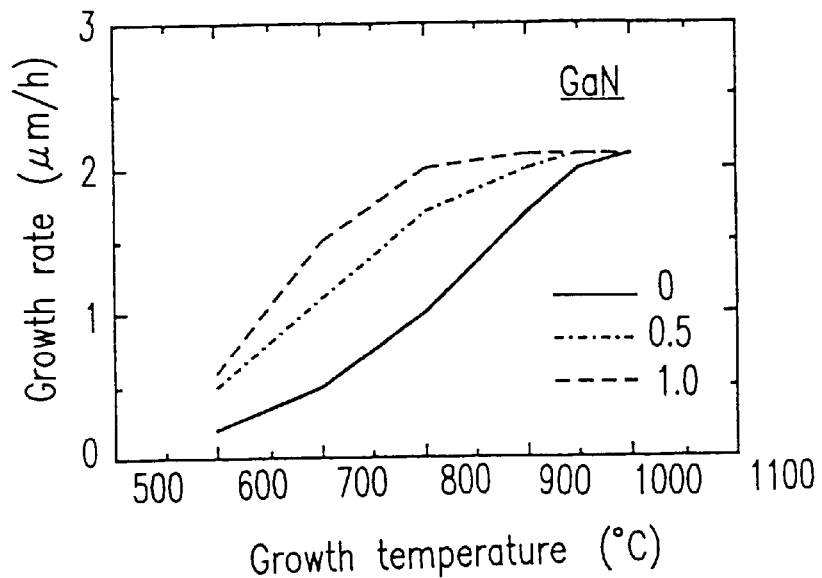
FIG. 6 is a graph showing the relationship between the growth rate and the growth temperature of a GaN film in the case where an amount of an organic radical source is varied.

FIG. 6 is a graph showing the relationship between the growth rate and the growth temperature of the GaN film in the case where the amount of the organic radical source is varied. As understood from FIG. 6, by adding the organic radical source, the growth rate is raised at a low temperature.

Example 9

Figure 7:
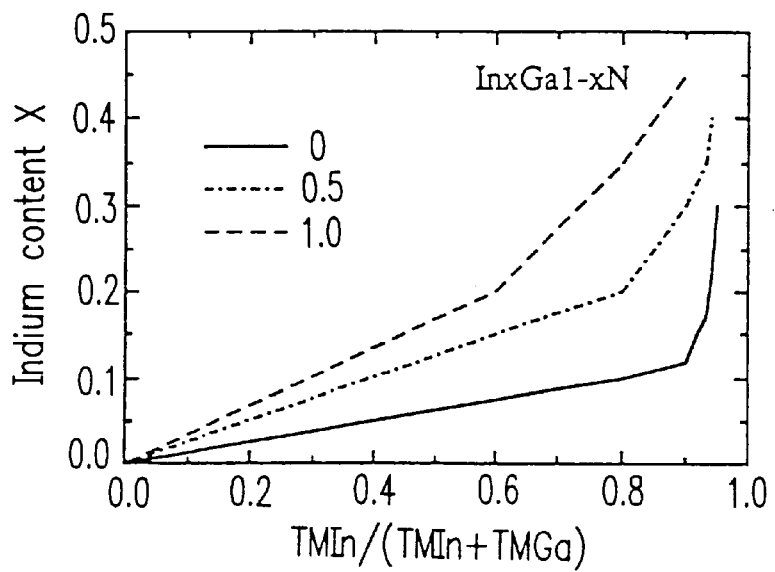
FIG. 7 is a graph showing the relationship between the supply ratio of an In material and the In composition in an obtained InGaN film (InGaN mixed crystal) in the case where an amount of an organic radical source is varied in forming the InGaN mixed crystal.

FIG. 7 is a graph showing the relationship between the supply ratio of an In material and the In composition in the obtained InGaN film (InGaN mixed crystal) in the case where the amount of the organic radical source is varied in forming the InGaN mixed crystal. This test was performed by the following procedure. An InGaN film was grown on the substrate having been subjected to the nitriding treatment by the procedure described in Embodiment 2 at a growth temperature of 800° C. TMIn as the In material and TMGa as the Ga material were used. Furthermore, azo-tertiary-butane as the organic radical source was used to be added at a mole ratio of 0, 0.5 and 1 with respect to the molar amount of the group III material supply (TMIn+TMGa). An In content of the InGaN film obtained by varying the value of TMIn/(TMIn+TMGa) while maintaining a molar amount of the group III material supply (TMIn+TMGa) constant was measured.

As understood from FIG. 7, in the case where azo-tertiary-butane is not added, the In content of the obtained InGaN film rapidly increases at about a TMIn/(TMIn+TMGa) of 0.9, and the composition is extremely difficult to control. On the other hand, in the case where azo-tertiary-butane is added, the In content of the InGaN film moderately increases, and the composition of the InGaN film to be obtained can be easily controlled.

Example 10

The influence of the organic radical source (e.g., azo-tertiary-butane) on the V/III ratio was examined. More specifically, a GaN crystal (GaN film) was grown at a growth temperature of 1000° C. by varying the V/III ratio with a constant supply amount of the group III material, both with and without azo-tertiary-butane.

Without azo-tertiary-butane, the GaN film obtained at a V/III ratio <1000 was colored yellow, and band edge emission intensity of PL measurements significantly decreased. On the order hand, in the case where azo-tertiary-butane was added at a mole ratio of 1 with respect to the group III material, there is little influence on the color of the obtained GaN film and band edge emission intensity of PL until at a V/III ratio of about 100.

Figure 8:
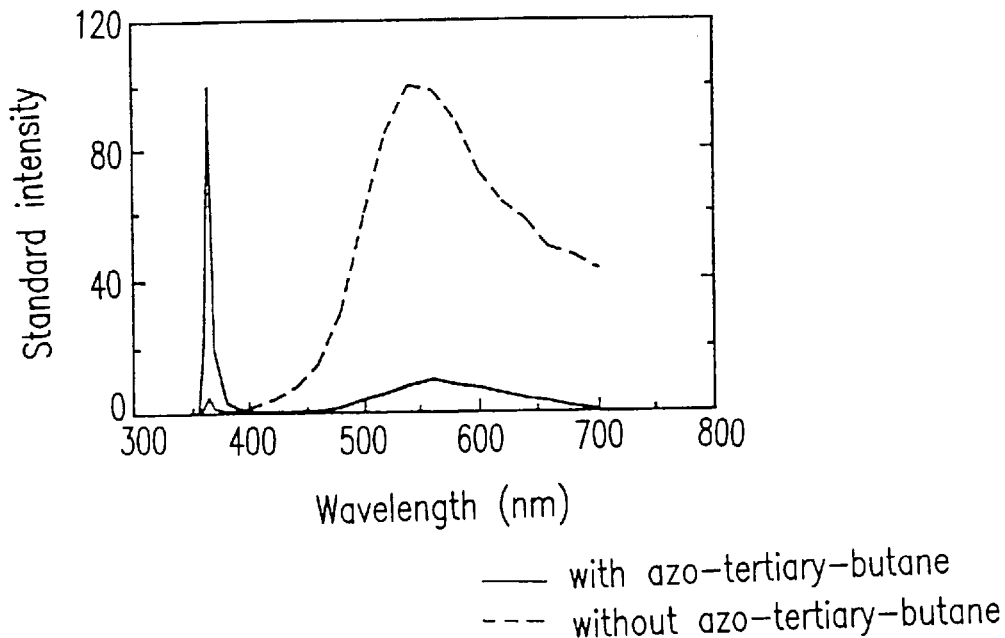
FIG. 8 is a graph showing the comparison of the PL intensity of the GaN film grown at a V/III ratio of 1000 between the cases where azo-tertiary-butane is used and is not used.

FIG. 8 is a graph illustrating the PL intensity of the GaN film grown at a V/III ratio of 1000 for comparison between the cases where azo-tertiary-butane is added and not added. As understood from FIG. 8, by adding azo-tertiary-butane, emission intensity at an band edge necessary for the production of a light emitting device can be obtained even with a small V/III ratio. In other words, by adding azo-tertiary-butane, a utilization efficiency of the material is significantly improved.

(Embodiment 3)

In this embodiment, a semiconductor light emitting device (light emitting diode) including an active layer formed of an InGaN crystal and upper and lower cladding layers formed of AlGaN crystals will be described.

The semiconductor light emitting device of this embodiment is the same as that of Embodiment 2 except that the upper cladding layer is formed of a 2 µm thick p-type $Al_{0.2}Ga_{0.8}N$ crystal, and the lower cladding layer is formed of a 2 µm thick n-type $Al_{0.2}Ga_{0.8}N$ crystal. The $Al_{0.2}Ga_{0.8}N$ crystals constituting the upper and lower cladding layers are formed by an organometallic vapor phase growth treatment, using an organometallic as the group III material, ammonia or an amine type material as the group V material and an organic compound generating radicals by pyrolysis as the organic radical source. The lower cladding layer is doped with Si as an n-type dopant to a carrier concentration of $5 \times 10^{18}$ cm$^{-3}$, and the upper cladding layer is doped with Mg as a p-type dopant to a carrier concentration of $5 \times 10^{17}$ cm$^{-3}$.

The method for producing a semiconductor light emitting device of Embodiment 3 is the same as that of Embodiment 2 except for the process of forming the upper and lower cladding layers. A crystal growth apparatus which is basically the same as the crystal growth apparatus shown in FIG. 5 is used for crystal growth of the semiconductor layers. However, the crystal growth apparatus used in this embodiment further includes a TMAl (trimethylaluminum) supply source.

Hereinafter, the method for producing the semiconductor light emitting device of this embodiment will be specifically described.

As in Embodiment 2, after the substrate is subjected to cleaning and a nitriding treatment, the substrate is set at the growth temperature (800° C.), and while maintaining this state, a group III gas is introduced into a reactor 26 to start crystal growth. At this point, an organic radical source is introduced into the reactor 26 at the same time with the group III material gas. Thus, a lower cladding layer formed of an n-type X AlGaN layer is formed on the substrate. Herein, using ammonia as the group V material, TMGa of a Ga material and TMAl of an Al material as the group III material, and a $SiH_4$ gas as an n-type dopant material gas are used.

The introduction ratio of TMGa and TMAl is adjusted so that the Al composition of the obtained AlGaN mixed crystal is 20%, and the molar amount of the group III material supply (TMGa+½ TMAl) is constant. (Here, since TMAl exists in dimer in the growth condition, group III material supply is represented by (TMGa+½ TMAl).) Furthermore, the AlGaN layer is grown at a V/III ratio of 8000. Azo-tertiary-butane (($t$-$C_4H_9$)$_2N_2$) is used as the organic radical source and introduced into the reactor 26 at a mole ratio of 1 with respect to a molar amount of the group III material (TMGa) supply.

Next, an active layer constituted by an InGaN layer is grown on the lower cladding layer in the same manner as in Embodiment 2. Furthermore, an upper cladding layer constituted by a p-type AlGaN layer is formed on the active layer in the same manner as the case of growing the lower cladding layer. Herein, however, as the dopant material for defining a conduction type, $EtCp_2Mg$ (bisethyl cyclopentadienylmagnesium) which is a p-type dopant material is used instead of an n-type dopant material gas ($SiH_4$ gas).

Thereafter, as in Embodiment 2, ohmic electrodes are formed in the exposed portions of the lower cladding layer and the surface of the upper cladding layer, and the substrate is divided to a predetermined size to complete a semiconductor light emitting device (LED chip).

Next, additional functions and effects of the present invention will be described.

According to this embodiment, as in Embodiment 2, the lower cladding layer 12, the active layer 13 and the upper cladding layer 14 constituting the semiconductor light emitting device can be sequentially formed at the same growth temperature (800° C. in this embodiment). Accordingly, since it is unnecessary to change the growth temperature for forming each layer, damage and quality deterioration at the semiconductor layer interface are not caused by heat during the period of time required to change the growth temperature. Moreover, dislocation is less likely generated at the semiconductor layer interface.

Furthermore, in this embodiment, as in Embodiment 2, it is significantly easy to obtain a p-type semiconductor by Mg doping. This means that there are few bonds of Mg atoms and hydrogen atoms in the obtained semiconductor layer (semiconductor film). In order words, the effect of the organic radicals can provide a semiconductor film scarcely containing hydrogen atoms (impurities).

Example 11

A test showing an effect of an organic radical in AlGaN crystal growth will be described.

An AlGaN crystal (AlGaN film) was formed by varying the amount of an organic radical source. More specifically, the organic radical source was added at a mole ratio of 0, 0.5 and 1 with respect to the group III material supply molar amount (TMGa+½ TMAl) so as to form an AlGaN film. TMGa as the Ga material and TMAl as the Al material were used, and the supply ratio of TMGa and TMAl was adjusted so that the Al composition in the obtained mixed crystal is 20%, and the molar amount of the group III material supply (TMGa+½ TMAl) was constant. Furthermore, ammonia was used as the group V material to perform crystal growth at a V/III ratio of 8000. Azo-tertiary-butane ($((t-C_4H_9)_2N_2)$) was used as the organic radical source. The details of the crystal growth are as described above.

Figure 9:
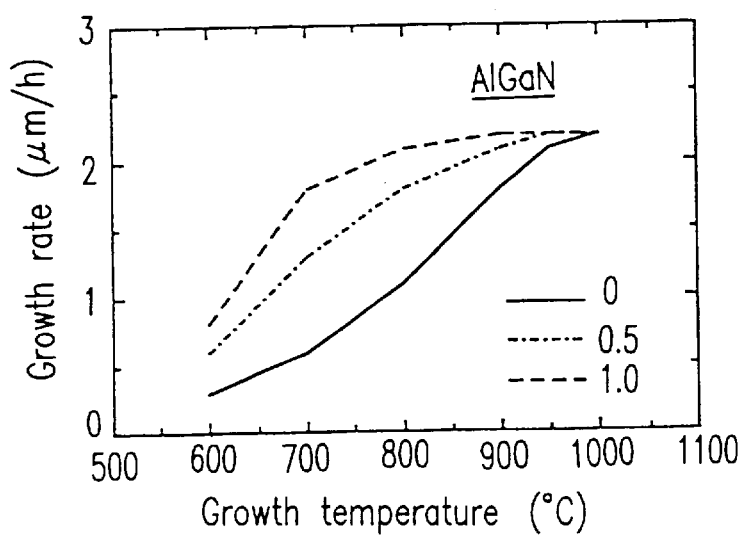
FIG. 9 is a graph showing the relationship between the growth rate and the growth temperature of an AlGaN film in the case where an amount of an organic radical source is varied.

FIG. 9 is a graph showing the relationship between the growth rate and the growth temperature of the AlGaN film in the case where the amount of the organic radical source is varied. As understood from FIG. 9, by adding the organic radical source, the growth rate is raised at a low temperature.

Example 12

The effect of the use of an organic radical source (e.g., azo-tertiary-butane) on a heterojunction interface between InGaN and AlGaN was examined.

More specifically, a heterojunction structure between InGaN and AlGaN (i.e., a multilayered structure of an InGaN layer and an AlGaN layer) was formed and an experiment for observing the state of the interface was carried out. In the case where azo-tertiary-butane was used, the InGaN layer and the AlGaN layer were sequentially grown at a growth temperature of 800° C. On the other hand, in the case where azo-tertiary-butane was not used, the InGaN layer was grown at a growth temperature of 800° C. Thereafter, the crystal growth was interrupted so as to raise the growth temperature to 1000° C., and in this state, the AlGaN layer was grown.

The heterointerface obtained by sequentially growing the InGaN layer and the AlGaN layer using azo-tertiary-butane was so flat that convexities and concavities were not observed. In contrast, the heterointerface obtained by growing the InGaN layer and the AlGaN layer at different growth temperatures without using azo-tertiary-butane was not flat from place to place, and the defects generated at the interface were observed by a factor of 10 or more, compared with the case where azo-tertiary-butane was used.

In Embodiments 1 to 3, the growth of the semiconductor layer on the sapphire substrate has been described. However, since the present invention does not theoretically require consideration on the influence of the substrate, the present invention can be effectively applied to any substrate such as an SiC substrate and a GaN substrate. Regardless of the type of the substrate, the semiconductor light emitting device obtained by the present invention provides strong emission by current injection.

Furthermore, the light emitting device with an In composition x in the $In_xGa_{1-x}N$ crystal constituting the active layer of 0.2 has been described in Embodiment 2, and the light emitting device with an Al composition y in the $Al_yGa_{1-y}N$ crystal constituting the upper and lower layers of 0.2 has been described in Embodiment 3. However, the In composition x and the Al composition y are not limited thereto. The In composition x in the $In_xGa_{1-x}N$ crystal constituting an light emitting layer (active layer) is especially effective in the range of $0 \leq x < 1$, and the Al composition y in the $Al_yGa_{1-y}N$ crystal constituting the upper and lower layers is especially effective in the range of $0 \leq y \leq 0.3$.

Furthermore, the cladding layer and the active layer may be constituted by an InGaAlN quaternary mixed crystal. In this case, as in the case of the InGaN crystal, by using the organic radical source, the composition of the obtained crystal can be satisfactorily controlled.

Figure 10:
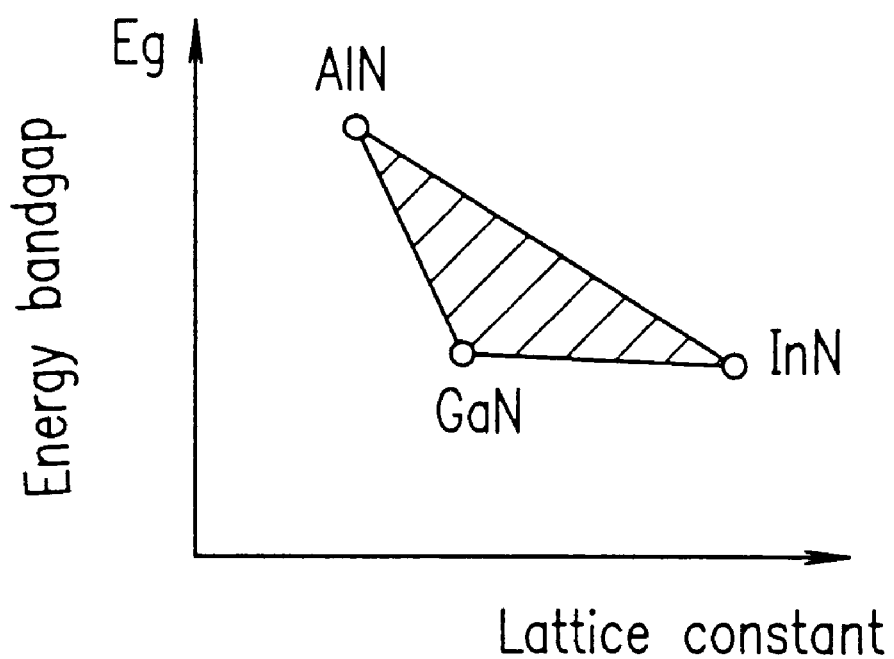
FIG. 10 is a graph showing the relationship between the lattice constant and the energy bandgap Eg of $In_xGa_yAl_{1-x-y}N$ ($0 \leq x$, $y \leq 1$).

With a quaternary material, as shown in Figure 10, an energy bandgap can be changed with a constant lattice constant. As a result, semiconductor layers with different energy bandgaps but the same lattice constant are formed using the quaternary material (the composition in the hatched region in FIG. 10), so that the deterioration of the characteristics of the device due to lattice mismatch in the semiconductor multilayered structure can be prevented.

Also for a quaternary mixed crystal, $In_xAl_yGa_{1-x-y}N$ (x+y<1) including In, Ga, Al; the In composition x is preferably in the range of $0 \leq x < 1$, and the Al composition y is preferably in the range of $0 \leq y \leq 0.3$. In such a range, the characteristics of the crystal are improved, and the composition of the crystal can be easily controlled.

(Embodiment 4)

Figure 11:
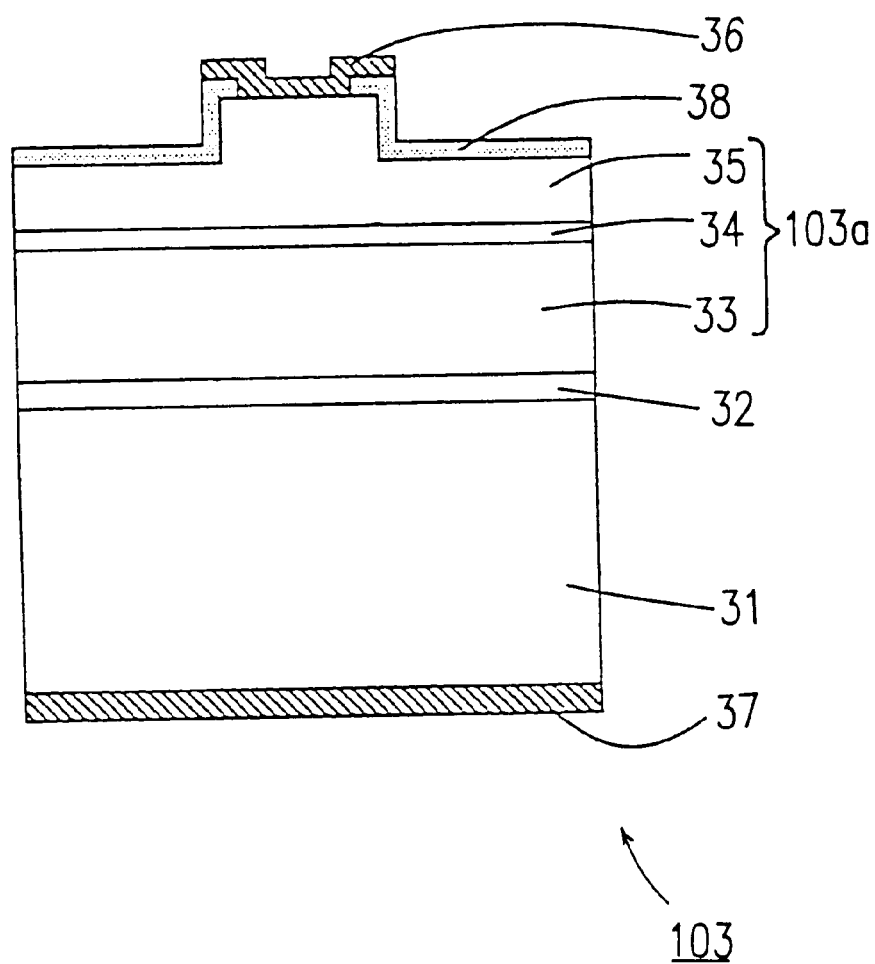
FIG. 11 is a schematic cross sectional view showing a semiconductor laser diode of another preferable embodiment of a semiconductor light emitting device of the present invention.

A semiconductor laser diode will be described as a preferable semiconductor light emitting device of the present invention. FIG. 11 is a schematic view showing an exemplary semiconductor laser diode.

As shown in FIG. 11, a semiconductor laser diode 103 includes a (0001) plane surface 6H-SiC substrate 31 and a semiconductor multilayered structure for generating stimulated emission light (laser light) 103a formed on the substrate 31 via an AlN buffer layer 32. The semiconductor multilayered structure 103a includes a lower cladding layer 33, an active layer 34 and an upper cladding layer 35 in this order.

Herein, the SiC substrate 31 is doped with N as an n-type dopant to a carrier concentration of $1\times10^{19}$ cm$^{-3}$. The lower cladding layer 33 is formed of a 1 μm thick n-type $Al_{0.2}Ga_{0.8}N$ layer which is doped with Si to a carrier concentration of $5\times10^{18}$ cm$^{-3}$. The active layer 34 is formed of a 7 nm thick $In_{0.2}Ga_{0.8}N$ layer. The upper cladding layer 35 is formed of a 1 μm thick p-type $Al_{0.2}Ga_{0.8}N$ layer which is doped with Mg to a carrier concentration of $1\times10^{18}$ cm$^{-3}$. The upper and lower cladding layers 35 and 33 and the active layer 34 are formed by an organometallic vapor phase growth treatment, using an organometallic compound as the group III material, ammonia or an amine type material as the group V material and an organic compound generating radicals by pyrolysis as the organic radical source.

The upper cladding layer 35 has a convex cross section. An ohmic electrode 36 is formed in a protruded portion, and a high resistive film 38 is formed on the sides of the protruded portion. Furthermore, an ohmic electrode 37 is formed on the lower face of the substrate 31. The materials for the high resistive film and the ohmic electrodes are not particularly limited, and any materials usable for the high resistive film and the ohmic electrode of the semiconductor laser diode can be used.

A light emitting operation of this semiconductor light emitting device will be described. A voltage is applied between the p-type electrode 36 and the n-type electrode 37 to allow current to flow, so that an electron concentration in the n-type cladding layer 33 and a hole concentration in the p-type cladding layer 35 increase. These increased electrons and holes drift to the InGaN active layer 34, and the electrons and the holes are rebound in the InGaN active layer 34. As a result, light corresponding to a band width is generated by energy generated by this recombination. The generated light is confined below the protruded portion in the direction parallel to the surface of the substrate and the facet of the substrate (i.e., parallel to the sheet) by a difference in the effective refractive index in the vicinity of the active layer generated by the protrusion. Moreover, the light is confined in the direction parallel to the extending direction of the protrusion and the direction parallel to the facet of the substrate (i.e., direction perpendicular to the sheet) by an optical mirror produced by cleavage in the direction perpendicular to the extending direction of the protrusion. The confined light in this manner is induction-released in the direction perpendicular to the facet of the substrate and the direction parallel to the extending direction of the protrusion (i.e., direction perpendicular to the sheet) by allowing current of a threshold or more to flow through the device. This light is emitted as laser beams.

Next, a preferable exemplary method for producing the semiconductor laser diode will be described.

In this embodiment, as in Embodiment 2, each semiconductor layer is grown using a crystal growth apparatus (MOCVD apparatus) basically having the structure shown in FIG. 5.

First, the substrate 31 is disposed in a reactor 26 of the MOCVD apparatus, and a nitriding treatment is performed in an atmosphere of ammonia ($NH_3$) at 1000° C. for 10 minutes. Thereafter, the substrate temperature is lowered to 800° C., and a predetermined amount of TMAl and azo-tertiary-butane are supplied into the reactor 26 so as to form an AlN buffer layer 32 with a thickness of 20 nm. The azo-tertiary-butane is supplied at a mole ratio of 1 with respect to the supply amount of TMAl.

Thereafter, the supply of TMGa is started, and the supply of TMAl is adjusted such that a semiconductor having predetermined compositions of Al and Ga (herein, 20% for Al and 80% for Ga) can be obtained. Moreover, $SiH_4$, which is an n-type dopant material gas, is supplied to the reactor 26 so as to grow the n-type AlGaN cladding layer 33 to a thickness of 1 μm.

Next, the supply of TMAl is stopped, and the supply of TMIn is started. Furthermore, the supply of TMGa is adjusted such that a semiconductor having predetermined compositions of In and Ga (herein, 20% for In and 80% for Ga) can be obtained, so as to form the InGaN active layer 34 with a thickness of 7 nm. Thereafter, the supply of TMIn is stopped, and TMAl and $EtCp_2Mg$ which is a p-type dopant material gas is supplied to the reactor 26, and the supply of TMGa is adjusted such that a semiconductor having predetermined compositions of Al and Ga (herein, 20% for Al and 80% for Ga) can be obtained, so as to grow the p-type AlGaN cladding layer 35 to a thickness of 1 μm.

The substrate which has been subjected to the crystal growth treatment in this manner is taken out of the reactor in the MOCVD apparatus, and the AlGaN layer 35 is selectively etched using a photolithography technique so that the cross section thereof is convex. Furthermore, the high resistive film 38 is formed on the surface of the AlGaN layer 35 using an electron beam evaporation technique. Then, the resistive film 38 in a portion corresponding to the protruded portion of the AlGaN layer 35 is removed using a chemical etching technique, and the ohmic electrode 36 with respect to the p-type AlGaN layer 35 is deposited on the protruded portion.

Then, the lower face of the substrate is polished until the thickness thereof becomes about 70 μm, and the ohmic electrode 37 with respect to the n-type SiC is formed on the lower face of the substrate by deposition. Then, the substrate is divided along cleavage or the like so as to form a resonator edge, and further divided into chips to complete semiconductor layer diodes.

As described above, according to the present invention, since the organic radical source (e.g., azo-tertiary-butane) is added in performing crystal growth of the AlGaN layer and the InGaN layer, the upper and lower AlGaN cladding layers and the InGaN active layer can be sequentially formed at a low temperature and the same growth temperature (800° C. in this embodiment). Accordingly, the interface between the active layer and the cladding layers can be flattened. As a result, the optical characteristics of the active layer becomes satisfactory, thus realizing a semiconductor laser diode capable of easily oscillating light with wavelengths from ultraviolet to green.

Furthermore, although the 6H-SiC substrate is used as the substrate in the present embodiment, the type of the substrate is not limited. According to the present invention, a semiconductor laser diode having an active layer with excellent optical characteristics can be obtained, regardless of the substrate.

Furthermore, although a semiconductor laser diode having the cladding layer constituted by the AlGaN crystal and the active layer constituted by the InGaN crystal has been described, the cladding layer and the active layer may be constituted by quaternary mixed crystals, $In_xAl_yGa_{1-x-y}N$ crystals including In, Ga and Al at different compositions. Also in this case, the optical characteristics of the active layer is satisfactory, thus realizing a-semiconductor laser diode capable of easily oscillating light with wavelengths from ultraviolet to green.

Next, a further preferable embodiment of the crystal growth apparatus of the present invention will be described.

In Embodiments 2 to 4, the apparatus having the structure where an organic radical source is supplied into a reactor through one gas introduction tube together with other material gases has been described as the crystal growth apparatus. However, an apparatus where the organic radical source can be introduced into an upper region of the substrate through a dedicated gas introduction tube is more preferable. With such an apparatus, although the organic radical source is readily decomposed by heat, generated radicals remain intact until reaching the substrate, and prereaction between other materials stemming from the radicals can be suppressed.

Figure 12A:
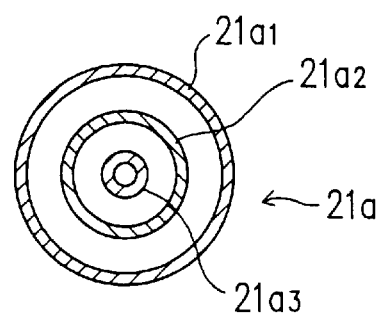
FIG. 12A is a schematic cross sectional view of a variation of a gas introduction tube of the crystal growth apparatus shown in FIG. 5 into a multiple structure.
Figure 12B:
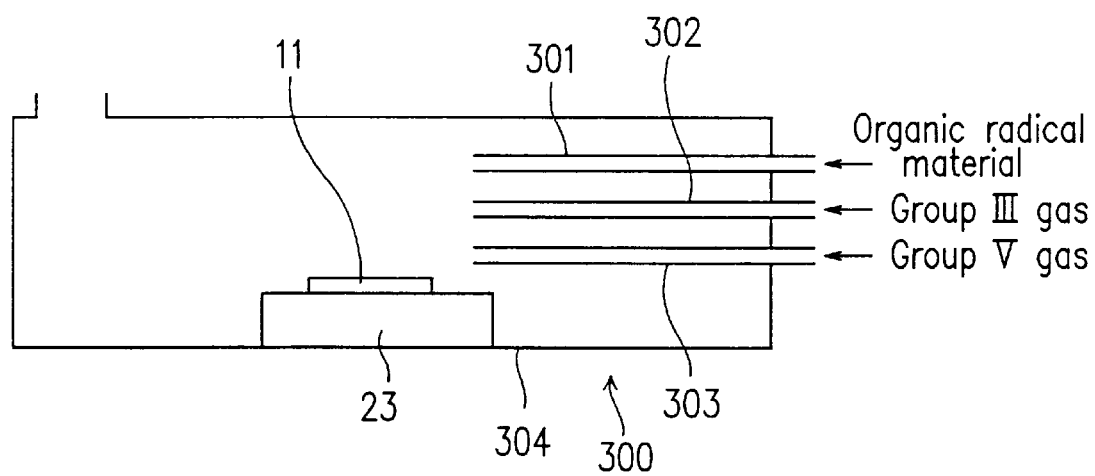
FIG. 12B is a schematic view of a lateral type crystal growth apparatus having gas introduction tubes for separately introducing a group III material, a group V material and an organic radical source.

FIGS. 12A and 12B are views illustrating an apparatus where a group III material, a group V material and an organic radical source are introduced into an upper portion of the substrate in a reactor through separate gas introduction tubes. FIG. 12A is a schematic cross sectional view of a variation of a gas introduction tube of the crystal growth apparatus shown in FIG. 5 into a multiple structure. FIG. 12B is a schematic view of a lateral type crystal growth apparatus having gas introduction tubes for separately introducing a group III material, a group V material and an organic radical source.

For example, in order to provide separate gas induction paths for the group III material, the group V material and the organic radical source, the apparatus is provided with a gas introduction tube 21a including small, medium and large gas introduction tubes 21a1, 21a2 and 21a3, respectively, with different diameters from each other, which are concentrically disposed, as shown in FIG. 12A. According to the gas introduction tube 21a, the group V material, the group III material and the organic radical source can be separately supplied in the following manner: the group V material is supplied through the most inward gas introduction tube 21a3; the group III material is supplied through the space between the most inward gas introduction tube 21a3 and the intermediate gas introduction tube 21a2; and the organic radical source is supplied through the space between the intermediate gas introduction tube 21a2 and the most outward gas introduction tube 21a1.

Alternatively, a lateral type crystal growth apparatus having gas introduction tubes for separately introducing the group III material, the group V material and the organic radical source, as shown in FIG. 12B, can be used. The lateral type crystal growth apparatus 300 includes a substrate 11 mounted on a susceptor 23 so as to perform crystal growth, as the vertical type crystal growth apparatus shown in FIG. 5. In the apparatus 300, the organic radical source, the group III gas, and the group V gas are supplied to a chamber 304 through upper, intermediate and lower gas introduction tubes 301, 302 and 303, respectively.

As described above, the organic radical source used in the present invention is not particularly limited, and any organic compounds can be used, as long as they do not impair the advantages of the present invention and can easily generate radicals. As understood from experiments, the same effect can be obtained using other compounds having an azo group (e.g., azomethane, benzene-azomethane) as well as azo-tertiary-butane as the organic radical source. This is because the compound having an azo group can be easily generate organic radicals by releasing $N_2$ by pyrolysis. Furthermore, as described above, a compound having an azide group and a hydrazine type compound can be preferably used.

As described above, any compounds can be used as the organic radical source in the present invention, as long as they can generate organic radicals by pyrolysis. However, it is preferable to select a compound having a suitable vapor pressure for organometallic vapor phase growth. This is because, in practice, the organic radical source is supplied to the reactor by bubbling of a liquid material stored in the container, as illustrated in FIG. 5. More specifically, when the vapor pressure of the organic radical source is excessively high, slight bubbling causes a large amount of the organic radical source to be supplied to the reactor. Thus, it is difficult to control the supply amount of the organic radical source. On the other hand, when the vapor pressure of the organic radical source is excessively low, a sufficient amount of the organic radical source cannot be supplied to the reactor even with much bubbling. In view of the vapor pressure as well, a compound having an azo group is preferable as the organic radical source. Azo-tertiary-butane and azomethane are especially preferable.

Hereinafter, various functions of the present invention will be described.

According to the present invention, an organic compound (organic radical source) which is decomposed by heat and generates radicals is used in forming a group III-V compound semiconductor or a group III-V compound semiconductor layer of a semiconductor light emitting device (hereinafter, referred to as a semiconductor layer for simplicity). The organic radicals generated from the organic radical source are active so as to facilitate the decomposition of the material formed into the semiconductor layer. Thus, a semiconductor light emitting device having a significantly reduced V/III ratio, an excellent efficiency of utilization of the material and an excellent growth rate of the semiconductor layer can be obtained. In other words, a semiconductor light emitting device excellent in economy and producibility can be obtained. The decrease of the V/III ratio is especially significant in the case where ammonia is used as the group V material.

As described above, the decomposition of the material formed into the semiconductor layer is facilitated, so that impurities incorporated into the obtained semiconductor layer and metal droplets detected in the film surface (layer surface) are reduced. Thus, a satisfactory semiconductor layer (thus semiconductor light emitting device) can be obtained.

Furthermore, since the organic radical source can be decomposed at low temperatures and generate radicals, the semiconductor layer can be formed at a low temperature. This effect is more significant in the case where an amine compound is used as the group V material.

Furthermore, the function of the organic radicals enable the group III-V compound semiconductor layers (nitride type semiconductor layers) with different compositions to be sequentially formed at substantially the same temperature, which was conventionally impossible. (For example, it is possible to form the semiconductor layer constituted by InGaN and the semiconductor layer constituted by AlGaN or GaN at substantially the same temperature.) Accordingly, since it is unnecessary to change the growth temperature in forming each layer, damage and quality deterioration at the semiconductor layer interface are not caused by heat during the period of time required to change the growth temperature, and dislocation can be less likely to be generated at the semiconductor layer interface. As a result, a semiconductor light emitting device excellent in the interface characteristics of the heterostructure can be obtained.

Preferably, such a heterostructure having excellent interface characteristics can be applied to a semiconductor multilayered structure for generating laser beams, resulting in the realization of a semiconductor light emitting device capable of generating laser beams with wavelengths in the range from ultraviolet to green.

Such a heterostructure having an excellent interface characteristics can be applied to a plurality of compound semiconductor layers constituted by a quaternary material (InAlGaN). In other words, occurrence of quality deterioration and dislocation at the heterojunction interface of the different compound semiconductor layers is suppressed, so that the device characteristics can be significantly satisfactory. Furthermore, since it is possible to form semiconductor layers with different energy band gaps and the same lattice constant in the case where a quaternary material is used, the deterioration of the device characteristics due to lattice mismatch in the semiconductor multilayered structure can be avoided.

The plurality of compound semiconductor layers constituted by such a quaternary material (InAlGaN) can also be applied to the semiconductor multilayered structure for generating laser beams, resulting in the realization of a semiconductor light emitting device capable of generating laser beams with wavelengths in the range from ultraviolet to green.

In a preferable embodiment, azo-tertiary-butane or azomethane can be used as the organic radical source. These substances can readily generate radicals by pyrolysis and have a vapor pressure suitable for being used in an organometallic vapor phase growth method. Thus, the decomposition efficiency of the material can be easily improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a group III-V compound semiconductor comprising nitrogen as a group V element, the method comprising:
    forming the group III-V compound semiconductor on a substrate by an organometallic vapor phase growth method,
    wherein an organometallic compound as a group III material, an amine type material or ammonia as a group V material and azo-tertiary-butane, azomethane and benzene azomethane as an organic compound which is decomposed by heating so as to generate radicals are used to perform crystal growth.

2. A method for producing a group III-V compound semiconductor comprising nitrogen as a group V element, the method comprising:
    forming the group III-V compound semiconductor on a substrate by an organometallic vapor phase growth method,
    wherein an organometallic compound containing group III-nitrogen bonds as a group III-V material and azo-tertiary-butane, azomethane and benzene azomethane as an organic compound which is decomposed by heating so as to generate radicals are used to perform crystal growth.

3. A method for producing a group III-V compound semiconductor according to claim 1, wherein the group III material is trimethylgallium, and the group V material is dimethylamine.

4. A method for producing a group III-V compound semiconductor according to claim 2, wherein the organometallic compound as a III-V material is $C_2H_6GaN_3$.

5. A method for producing a semiconductor light emitting device using an organometallic vapor phase growth method comprising the step of:
    forming a plurality of semiconductor layers each constituted by a compound of a predetermined metal selected from the group consisting of Ga, Al and In and nitrogen,
    wherein, in the semiconductor layer forming step, an organometallic compound as a group III material, ammonia or an amine type material as a group V material and azo-tertiary-butane, azomethane and benzene azomethane as an organic compound which is decomposed by heating so as to generate radicals as an organic radical source are supplied to a reaction region.

6. A method for producing a semiconductor light emitting device according to claim 5, wherein the plurality of semiconductor layers are formed at substantially a same growth temperature.

7. A method for producing a semiconductor light emitting device according to claim 5, comprising the step of forming a semiconductor layer constituted by InGaN.

8. A method for producing a semiconductor light emitting device according to claim 5, comprising the step of forming a semiconductor layer constituted by InGaN and a semiconductor layer constituted by Al GaN, wherein these two semiconductor layers are formed at substantially same growth temperature.

9. A method for producing a semiconductor comprising nitrogen as a group V material, the method comprising:
    forming a plurality of semiconductor layers each constituted by a compound of a predetermined metal selected from the group consisting of Ga, Al and In and nitrogen on a substrate by an organometallic vapor phase growth method,
    wherein, in the semiconductor layer forming step, an organometallic compound as a group III material, an amine type material or ammonia as a group V material and azo-tertiary butane, azomethane and benzene azomethane as an organic compound which is decomposed by heating so as to generate radicals as an organic radical source are used to perform crystal growth.

10. A method for producing a semiconductor according to claim 9,
    wherein the group III material is trimethylgallium, and the group V material is dimethyl amine.

11. A method for producing a semiconductor comprising nitrogen as a group V material, the method comprising:
    forming a plurality of semiconductor layers each constituted by a compound of a predetermined metal selected from the group consisting of Ga, Al and In and nitrogen on a substrate by an organometallic vapor phase growth method,
    wherein, an organometallic compound containing group III-nitrogen bonds as a group III-V material and azo-tertiary butane, azomethane and benzene azomethane as an organic compound which is decomposed by heating so as to generate radicals are used to perform crystal growth.

12. A method for producing a semiconductor according to claim 11, wherein the organometallic compound as a III-V material is $C_2H_6GaN_3$.

13. A method for producing a group III-V compound semiconductor according to claim 2 further comprising the step of forming a plurality of semiconductor layers each constituted by a compound of predetermined metal selected from the group consisting of Ga, Al and In and nitrogen.

14. A method for producing a group III-V compound semiconductor according to claim 13, wherein the organometallic compound as a III-V material is $C_2H_6GaN_3$.

15. A method for producing a semiconductor light emitting device comprising the step of:
    forming a plurality of semiconductor layers each constituted by a compound of a predetermined metal selected from the group consisting of Ga, Al and In and nitrogen on a substrate by an organometallic vapor phase growth method, wherein, in the semiconductor layer forming step, an organometallic compound as a group III material, ammonia or an amine type material as a group V material and azo-tertiary-butane, azomethane and benzene azomethane as an organic compound which is decomposed by heating so as to generate radicals as an organic radical source are supplied to a reaction region.

* * * * *